(12) United States Patent
Kim

(10) Patent No.: US 7,554,354 B2
(45) Date of Patent: Jun. 30, 2009

(54) APPARATUS FOR CONTROLLING ON-DIE TERMINATION OF SEMICONDUCTOR MEMORY AND METHODS OF CONTROLLING THE SAME

(75) Inventor: Yong-Mi Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/822,102

(22) Filed: Jul. 2, 2007

(65) Prior Publication Data

US 2008/0042684 A1 Feb. 21, 2008

(30) Foreign Application Priority Data

Aug. 16, 2006 (KR) .................. 10-2006-0076948

(51) Int. Cl.
*H03K 17/16* (2006.01)
(52) U.S. Cl. .................. 326/30; 326/16; 714/25; 365/189.05; 365/201
(58) Field of Classification Search .......... 326/16, 326/30, 26, 27, 86, 87; 327/108, 109; 365/189.05, 365/189.11, 202, 233.1
See application file for complete search history.

(56) References Cited

U.S. PATENT DOCUMENTS

| | | | |
|---|---|---|---|
| 6,531,911 B1 | 3/2003 | Hsu et al. | |
| 6,876,250 B2 | 4/2005 | Hsu et al. | |
| 7,138,823 B2 | 11/2006 | Janzen et al. | |
| 2003/0012046 A1* | 1/2003 | Lee et al. | 365/63 |
| 2005/0231230 A1* | 10/2005 | Na et al. | 326/30 |
| 2005/0283671 A1* | 12/2005 | Stave | 714/31 |
| 2006/0002196 A1* | 1/2006 | Furuyama et al. | 365/189.05 |
| 2006/0111865 A1 | 5/2006 | Choi | |
| 2006/0120206 A1* | 6/2006 | Kim | 365/233 |
| 2006/0158214 A1 | 7/2006 | Janzen et al. | |
| 2007/0030051 A1* | 2/2007 | Lee et al. | 327/525 |
| 2007/0040574 A1 | 2/2007 | Janzen et al. | |
| 2007/0126467 A1* | 6/2007 | Kim | 326/30 |
| 2008/0100335 A1* | 5/2008 | Choi et al. | 326/30 |

FOREIGN PATENT DOCUMENTS

| | | |
|---|---|---|
| JP | 10255467 | 9/1998 |
| KR | 1020030083237 | 10/2003 |
| KR | 1020050095387 | 9/2005 |
| KR | 1020050101865 | 10/2005 |

* cited by examiner

*Primary Examiner*—James H. Cho
*Assistant Examiner*—Jany Tran
(74) *Attorney, Agent, or Firm*—Venable LLP; Jeffri A. Kaminski

(57) ABSTRACT

An apparatus for controlling on-die termination of a semiconductor memory includes a detector that generates an ODT control signal for inactivating an on-die termination operation in one of a data read period and a data write period in response to a command signal for testing the on-die termination operation, and a controller that inactivates the on-die termination operation in response to the ODT control signal.

17 Claims, 2 Drawing Sheets

APPARATUS FOR CONTROLLING ON-DIE TERMINATION OF SEMICONDUCTOR MEMORY AND METHODS OF CONTROLLING THE SAME

CROSS-REFERENCE TO RELATED APPLICATION

This application claims priority from Korean Patent Application No. 10-2006-0076948 filed on Aug. 16, 2006 in the Korean Intellectual Property Office, the disclosure of which is incorporated herein by reference in its entirety.

BACKGROUND OF THE INVENTION

1. Technical Field

The present invention relates to a semiconductor memory, and more particularly, to an apparatus for controlling on-die termination of a semiconductor memory and method of controlling the same.

2. Related Art

In general, when signals that are transmitted through a bus line having a predetermined impedance value meet a bus line having a different impedance value, some of the signals are lost. On-die termination (hereinafter, simply referred to as "ODT") refers to the reduction of the signal loss through impedance matching of the two bus lines.

In general, the ODT can be controlled according to logical levels of some addresses of EMRS (Extended Mode Register Set) code addresses. That is, an appropriate effective resistance value is generated by an ODT signal that responds to the logical levels of some addresses, such that an ODT operation can be controlled. The ODT operation is usually activated during a write operation. However, an ODT circuit unit is designed regardless of the write/read operation.

While the ODT circuit unit operates, a failure may occur during the write/read operation of a DRAM. However, it may be difficult to determine whether the failure during the ODT operation results from an erroneous operation of the ODT circuit unit or the write or read operation of the actual DRAM.

When a failure related to the ODT circuit actually occurs, the failure is rarely analyzed. The failure may work as a delay factor in the development of the semiconductor memory and may affect the time to market.

SUMMARY OF THE INVENTION

Embodiments provide an apparatus and method of controlling on-die termination of a semiconductor memory, capable to improve failure characteristic of ODT.

According to one embodiment, an apparatus for controlling on-die termination of a semiconductor memory includes a detector that generates an ODT control signal for inactivating an on-die termination operation in one of a data read period and a data write period in response to a command signal for testing the on-die termination operation, and a controller that inactivates the on-die termination operation in response to the ODT control signal.

According to another embodiment, a method of controlling on-die termination of a semiconductor memory includes generating an ODT control signal for inactivating an on-die termination operation in one of a data read period and a data write period in response to a command signal for testing the on-die termination operation, and inactivating the on-die termination operation in response to the ODT control signal.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF EXEMPLARY EMBODIMENT

Figure 1:
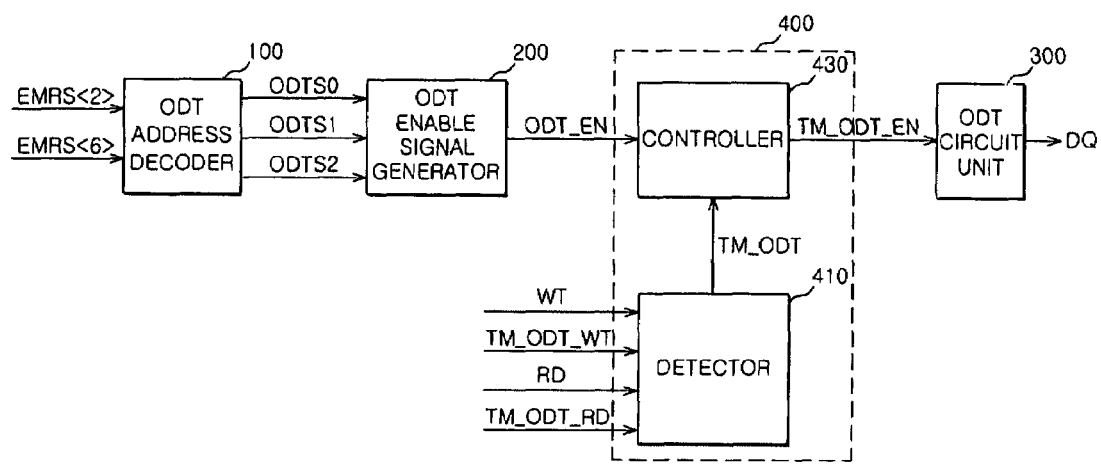
FIG. 1 is a block diagram showing an apparatus for controlling on-die termination according to an embodiment of the present invention.

The attached drawings for illustrating preferred embodiments of the present invention are referred to in order to gain a sufficient understanding of the present invention, the merits thereof, and the objectives accomplished by the implementation of the present invention.

Hereinafter, the present invention will be described in detail by explaining preferred embodiments of the invention with reference to the attached drawings. Like reference numerals in the drawings denote like elements.

An apparatus for controlling on-die termination of a semiconductor memory according to one embodiment will now be described in detail with reference to FIGS. 1 and 2.

As shown in FIG. 1, an apparatus for controlling on-die termination 400 according to an embodiment of the present invention includes a detector 410 and a controller 430.

The detector 410 generates a test mode ODT control signal TM_ODT that inactivates the ODT operation in one of a write period and a read period in response to a command signal for testing the ODT operation.

More specifically, the detector 410 receives a write signal WT, a test mode ODT write signal TM_ODT_WT, a read signal RD, and a test mode ODT read signal TM_ODT_RD, to generate the test mode ODT control signal TM_ODT. Here, the test mode ODT write signal TM_ODT_WT and the test mode ODT read signal TM_ODT_RD are external command signals for testing the ODT operation in the write period or the read period, respectively.

Accordingly, when receiving the activated external command signal TM_ODT_WT or TM_ODT_RD, the detector 410 supplies the inactivated test mode ODT control signal TM_ODT to the controller 430 in the write period or the read period.

The controller 430 receives the test mode ODT control signal TM_ODT and an ODT enable signal ODT_EN to supply a test mode ODT enable signal TM_ODT_EN.

More specifically, the controller 430 logically combines the ODT enable signal ODT_EN supplied from a signal generator 415 with the test mode ODT control signal TM_ODT, to supply the test mode ODT enable signal TM_ODT_EN. In particular, when the test mode ODT control signal TM_ODT is inactivated, the test mode ODT enable signal TM_ODT_EN can be inactivated. Accordingly, the ODT operation can be inactivated by the inactivated ODT enable signal ODT_EN.

The operation of the detector 410 will be described in detail with reference to the block diagram of FIG. 2.

Figure 2:
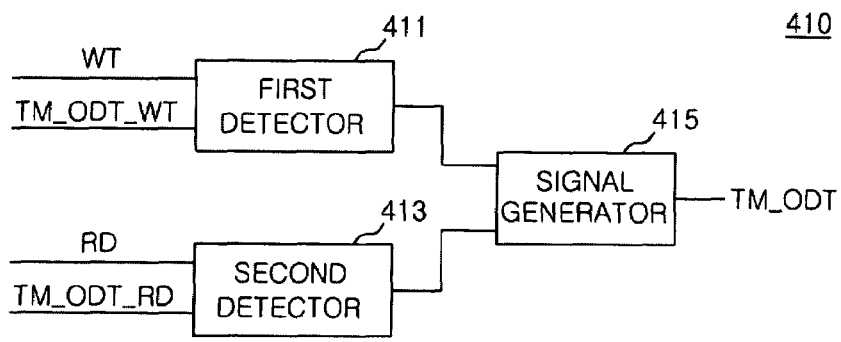
FIG. 2 is a block diagram showing the structure of a detector of FIG. 1.

As shown in FIG. 2, the detector 410 may include a first detector 411, a second detector 413, and a signal generator 415.

The first detector 411 receives the write signal WT and the test mode ODT write signal TM_ODT_WT to supply a signal responding to the two signals, thereby controlling the ODT operation in the write period.

The second detector 413 receives the read signal RD and test mode ODT read signal TM_ODT_RD to supply a signal responding to the two signals, thereby controlling the ODT operation in the read period.

The signal generator 415 receives the signals supplied from the first detector 411 and the second detector 413, to generate the test mode ODT control signal TM_ODT.

That is, the detector 410 may inactivate the test mode ODT control signal TM_ODT by an inactivation signal detected by the first detector 411 or the second detector 413.

Returning to FIG. 1, when receiving the inactivated test mode ODT control signal TM_ODT, the controller 430 inactivates the ODT operation of an ODT circuit unit 300 in the write or read period.

Specifically, when receiving the inactivated test mode ODT control signal TM_ODT, the controller 430 supplies the inactivated test mode ODT enable signal TM_ODT_EN regardless of a logical level of the ODT enable signal ODT_EN to be supplied from an ODT enable signal generator 200.

Further, since the controller 430 supplies the inactivated test mode ODT enable signal TM_ODT_EN, the ODT operation of the ODT circuit unit 300 can be inactivated in the write or read period.

The above-described operation according to an embodiment of the present invention will now be described with reference to circuit diagrams of FIGS. 3 and 4.

Figure 3:
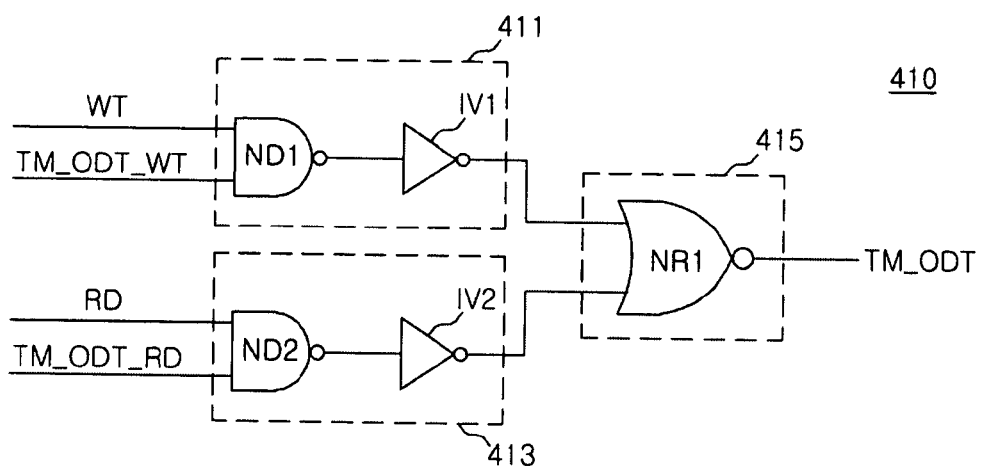
FIG. 3 is a circuit diagram showing the structure of the detector of FIG. 2.
Figure 4:
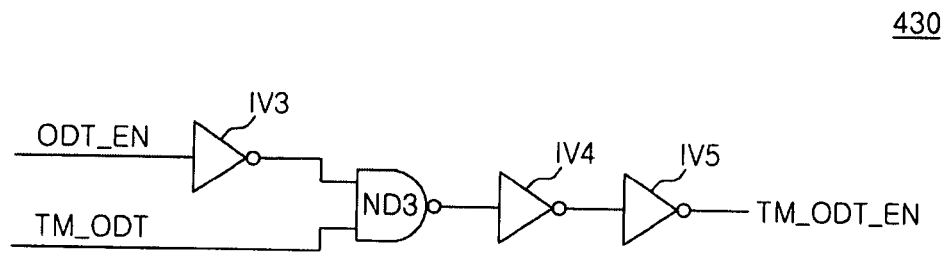
FIG. 4 is a circuit diagram showing the structure of a controller of FIG. 1.

Referring to FIGS. 3 and 4, the first detector 411 includes a first NAND gate ND1 that receives the write signal WT and the test mode ODT write signal TM_ODT_WT, and a first inverter IV1.

The second detector 413 includes a second NAND gate ND2 that receives the read signal RD and the test mode ODT read signal TM_ODT_RD, and a second inverter IV2.

The signal generator 415 includes a first NOR gate NR1 that logically combines the signals supplied from the first detector 411 and the second detector 413.

Referring to FIG. 4, the controller 430 includes a third inverter IV3, a third NAND gate ND3, a fourth inverter IV4, and a fifth inverter IV5.

The third inverter IV3 inverts the ODT enable signal ODT_EN and supplies the inverted ODT enable signal.

The third NAND gate ND3 receives the test mode ODT control signal TM_ODT to be supplied from the first NOR gate NR1 of the detector 410, and a signal supplied from the third inverter IV3, to provide a signal level through the NAND gate operation.

Each of the fourth inverter IV4 and the fifth inverter IV5 may be a delay circuit. However, the present invention is not limited thereto. For example, and the fourth and fifth inverters IV4 and IV5 may have a chain of several or more inverters or RC delay circuits according to how much the output time is delayed.

The operation of the circuit having the above-described structure will now be described.

First, when the first NAND gate ND1 receives the test mode ODT write signal TM_ODT_WT at a high level, the first NAND gate ND1 outputs a signal having a low level through the NAND gate operation. The signal at the low level is inverted by the first inverter IV1. The outputting signal of the first inverter IV1 is input to the signal generator 415, the signal generator 415 outputs the inactivated test mode ODT control signal TM_ODT at a low level through a NOR gate operation of the first NOR gate NR1

The test mode ODT control signal TM_ODT at the low level is received by the third NAND gate ND3 of the controller 430. And then the third NAND gate ND3 outputs the signal at a high level, the signal at high level is delayed by the fourth and fifth inverters IV4 and IV5, thereby generating the test mode ODT enable signal TM_ODT_EN at a high level. The ODT circuit unit 300 is inactivated by the test mode ODT enable signal TM_ODT_EN at the high level. That is, when the controller 430 receives the test mode ODT control signal TM_ODT at a low level, the ODT circuit unit 300 can be inactivated regardless of the level of the ODT enable signal ODT_EN.

Meanwhile, when the second NAND gate ND2 receives the test mode ODT read signal TM_ODT_RD at a high level, the second NAND gate ND2 supplies a signal at low level through a NAND gate operation. The signal at the low level is inverted by the second inverter IV2. The signal inverted by the inverter IV2 is input to the signal generator 415, and then the signal generator 415 outputs the inactivated test mode ODT control signal TM_ODT at a low level through a NOR gate operation of the first NOR gate NR1. In the same manner, when the test mode ODT control signal TM_ODT at the low level is input to the controller 430, the ODT circuit unit 300 can be inactivated regardless of the level of the ODT enable signal ODT_EN.

According to an embodiment of the present invention, the ODT operation can be inactivated in any one of the write period and the read period according to the command signal for testing the ODT operation. Further, since the ODT operation can be controlled by the write or read test mode control signal that is supplied from the detector and responds to the write or read command signal, a write failure or a read failure can be determined.

Here, the write signal WT may be substituted with any signal at a high level in the write period, and the read signal RD may be substituted with any signal at a high level in the read period.

Meanwhile, a description will be given for a case in which both the test mode ODT write signal TM_ODT_WT and the test mode ODT read signal TM_ODT_RD for performing the ODT operation in a test mode are at a low level.

Here, the detector 410 outputs the test mode ODT control signal TM_ODT at a high level, and the controller 430 outputs the test mode ODT enable signal TM_ODT_EN having the same level as the ODT enable signal ODT_EN. In this case, the test mode ODT enable signal TM_ODT_EN may be a signal that is obtained by simply delaying the ODT enable signal ODT_EN. Therefore, similar to this case, when the signal for performing the ODT operation in the test mode is not applied to the ODT circuit unit 300, the ODT circuit unit 300 operates depending on the ODT enable signal ODT_EN generated according to internal control signals ODTS0, ODTS1, and ODTS2 to be obtained by decoding the EMRS code, for example, with ODT address decoder 100 (FIG. 1) addresses.

According to the apparatus and method of controlling ODT of the semiconductor memory, the ODT operation in the read period or the write period can be dividedly observed in the test mode. Accordingly, when analyzing a failure in the data read/write operation during the ODT operation, it is possible to easily find the cause of the failure by enabling/disabling the ODT operation in the read or write period. In this way, the delay factor for development of the semiconductor memory can be eliminated, such that smooth development of the semiconductor memory can be expected.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. An apparatus for controlling on-die termination of a semiconductor memory, the apparatus comprising:
   a detector that generates an ODT (On-Die Termination) control signal in response to a command signal for testing the on-die termination operation; and
   a controller that generates a test mode ODT enable signal for inactivating the on-die termination operation in response to the ODT control signal,
   wherein the command signal for testing is a signal to set a data read or write period, and the ODT control signal is a signal to reflect information of a data read or write mode.

2. The apparatus of claim 1,
   wherein the detector inactivates the ODT control signal in the data write period in response to the command signal for testing the on-die termination operation in the data write period.

3. The apparatus of claim 2,
   wherein the controller inactivates the test mode ODT enable signal for controlling the on-die termination operation when the ODT control signal is inactivated.

4. The apparatus of claim 1,
   wherein the detector inactivates the ODT control signal in the data read period in response to the command signal for testing the on-die termination operation in the data read period.

5. The apparatus of claim 4,
   wherein the controller inactivates the test mode ODT enable signal for controlling the on-die termination operation when the ODT control signal is inactivated.

6. The apparatus of claim 1,
   wherein the detector comprising:
   a first detector that detects a period where the on-die termination operation is to be inactivated, in response to a write signal and the command signal for testing the on-die termination operation in the data write period, to obtain a detected period and provide an output signal; and
   a signal generator that generates the ODT control signal for inactivating the on-die termination in the detected period in response to the output signal of the first detector.

7. The apparatus of claim 6,
   wherein the first detector comprises:
   a first NAND gate that receives the write signal and the command signal as input for testing the on-die termination operation in the write period and provides an output signal; and
   a first inverter that inverts the output signal of the first NAND gate to provide an output signal, and
   wherein the signal generator comprises:
   a first NOR gate that receives the output signal of the first inverter.

8. The apparatus of claim 1,
   wherein the detector comprises:
   a second detector that detects a period where the on-die termination operation is to be inactivated, in response to a read signal and the command signal for testing the on-die termination operation in the data read period to obtain a detected period and provide an output signal; and
   a signal generator that generates the ODT control signal for inactivating the on-die termination operation in the detected period in response to the output signal of the second detector.

9. The apparatus of claim 8,
   wherein the second detector comprises:
   a second NAND gate that receives the read signal and the command signal for testing the on-die termination operation in the read period and provides an output signal; and
   a second inverter that inverts the output signal of the second NAND gate and provides an output signal, and
   wherein the signal generator comprising:
   a second NOR gate that receives the output signal of the second inverter.

10. The apparatus of claim 1,
    wherein the controller inactivates the test mode ODT enable signal for controlling the on-die termination operation in response to the ODT control signal.

11. The apparatus of claim 10,
    wherein the controller comprises:
    a third NAND gate that receives an inverted signal of the test mode ODT enable signal and the ODT control signal.

12. A method of controlling on-die termination of a semiconductor memory, the method comprising:
    generating an ODT control signal in response to a command signal for testing the on-die termination operation; and
    generating a test mode ODT enable signal for inactivating the on-die termination operation in response to the ODT control signal,
    wherein the command signal for testing is a signal to set a data read or write period, and the ODT control signal is a signal to reflect information of a data read or write mode.

13. The method of claim 12,
    wherein the generating of the ODT control signal inactivates the ODT control signal in the data write period in response to the command signal for testing the on-die termination operation in the write period.

14. The method of claim 13,
    wherein the inactivating of the on-die termination operation inactivates the test mode ODT enable signal for controlling the on-die termination operation when the ODT control signal is inactivated.

15. The method of claim 12,
    wherein the generating of the ODT control signal inactivates the ODT control signal in the data read period in response to the command signal for testing the on-die termination operation in the read period.

16. The method of claim 15,
    wherein the inactivating of the on-die termination operation inactivates the test mode ODT enable signal for controlling the on-die termination operation when the ODT control signal is inactivated.

17. The method of claim 12,
    wherein the inactivating of the on-die termination operation inactivates the test mode ODT enable signal for controlling the on-die termination operation in response to the ODT control signal.

* * * * *